United States Patent
Beer et al.

(10) Patent No.: US 6,671,221 B2
(45) Date of Patent: Dec. 30, 2003

(54) SEMICONDUCTOR CHIP WITH TRIMMABLE OSCILLATOR

(75) Inventors: Peter Beer, Tutzing (DE); Carsten Ohlhoff, München (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/154,343

(22) Filed: May 23, 2002

(65) Prior Publication Data
US 2002/0177267 A1 Nov. 28, 2002

(30) Foreign Application Priority Data
May 23, 2001 (DE) .......................................... 101 25 164

(51) Int. Cl.$^7$ ................................................. G11C 8/18
(52) U.S. Cl. ...................... 365/233; 365/222; 365/201; 365/236; 327/113
(58) Field of Search ................................. 365/233, 236, 365/222, 201; 327/113

(56) References Cited

U.S. PATENT DOCUMENTS

| 5,587,691 A | * | 12/1996 | Yabe et al. .................... 331/44 |
| 5,642,309 A | * | 6/1997 | Kim et al. ............. 365/185.22 |
| 5,933,370 A | * | 8/1999 | Holzmann et al. ...... 365/189.05 |
| 5,995,413 A | * | 11/1999 | Holzmann et al. ...... 365/185.09 |

FOREIGN PATENT DOCUMENTS

| EP | 0 659 310 B1 | 6/1995 | ............ H03B/1/00 |

* cited by examiner

*Primary Examiner*—Andrew Q. Tran
(74) *Attorney, Agent, or Firm*—Laurence A. Greenberg; Werner H. Stemer; Ralph E. Locher

(57) ABSTRACT

A semiconductor chip, particularly a semiconductor memory, has a trimmable oscillator for controlling internal functions. A circuit is provided for trimming the frequency of the oscillator and is implemented on the semiconductor chip. This guarantees a parallel setting of the oscillator frequency for a plurality of semiconductor chips without losses in yield or quality.

9 Claims, 1 Drawing Sheet

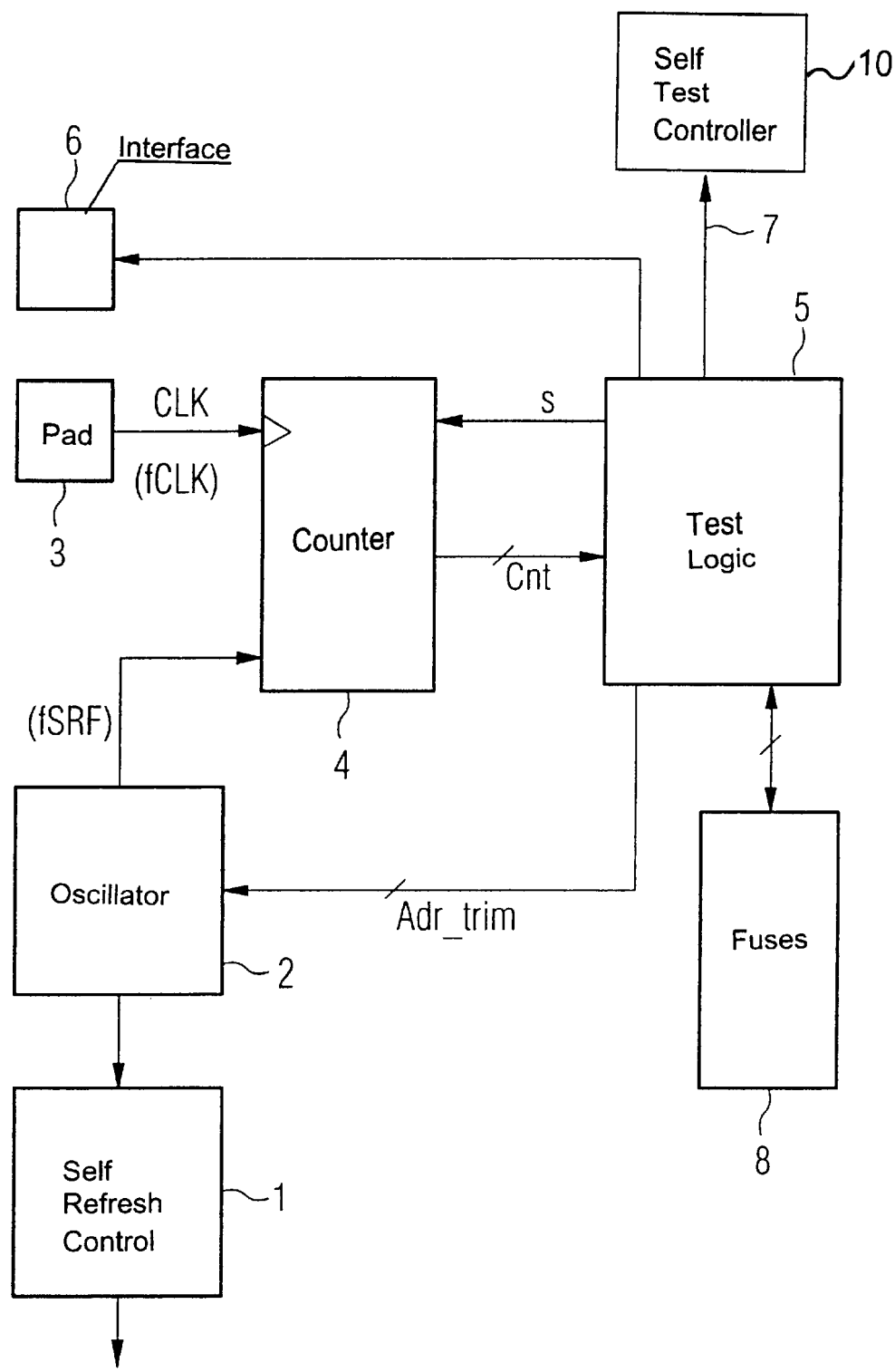

SEMICONDUCTOR CHIP WITH TRIMMABLE OSCILLATOR

BACKGROUND OF THE INVENTION

Field of the Invention

The invention relates to a semiconductor chip, particularly a semiconductor chip with at least one oscillator for controlling internal functions.

A number of oscillators are often implemented on semiconductor chips (known as ICs) and employed for various functions. Typical applications of the oscillators are voltage pumps or what is known as self-refresh control in DRAM memories (hereinafter DRAMs). In finished chips, the frequencies of the oscillators exhibit a particular distribution that is the unavoidable result of production-related parameter fluctuations. In order to reduce the distribution ranges and generate an identical (that is to say, controlled) frequency for all chips, the oscillators must be set to their assigned frequency in the context of a test program, with which the functionality of the semiconductor chip is otherwise tested. An important instance of application in this regard is the oscillator for the self-refresh control on a DRAM. Here, sharp frequency deviations lead either to an elevated standby power consumption or even to failure of individual memory cells, which is known as retention failure.

The aforementioned test program is usually executed at an early point in chip production, typically on the wafer plane. In the case of a self-refresh oscillator of a DRAM, the setting of the oscillators, also known as trimming, occurs on the wafer plane in that the oscillator signal is driven out at a chip terminal (I/O) by activation of a suitable test mode. An external test device is provided in order to measure the oscillator signal and determine the instantaneous frequency of the oscillator signal. The semiconductor chip, in this case the semiconductor memory (DRAM), is typically provided with an internal logic, which allows the modifying or trimming of the frequency of the oscillator. On the basis of the measured frequency, correction information is calculated, which can be stored in a non-volatile fashion on the chip by fuses (a laser fuse or electrical fuse—hereinafter E-fuse). In order to increase the accuracy of the oscillator frequency trimming, the correction value for the frequency that is obtained in a first measuring step must be programmed as a trial value into the step that is to be tested. In a new frequency measuring step, it is then checked whether the frequency is sufficiently near the desired value, or whether additional fine corrections are needed.

This type of oscillator frequency trimming with the aid of an external testing device is time-consuming and must be performed for each chip individually in certain circumstances. Besides this, frequency measuring on a typically digital testing device is only possible at great cost and with long test times.

In principle, it is possible to measure the oscillator frequencies of a number of chips in a parallel fashion and not to verify an ascertained correction address at the relevant chip. But this leads to a loss of precision and thus to losses in yield and lower quality.

The high testing outlay cannot be overcome by a parallel test sequence. The reason is that each chip must be corrected individually, and therefore time cannot be gained by parallel testing. In light of the fact that wafer tests are otherwise being increasingly conducted in parallel fashion, this circumstance leads to a rising proportion of the test outlay being expended in trimming the oscillator frequency. Particularly in light of the full wafer test, i.e. the parallel testing of the whole wafer, which has been discussed though not yet implemented, the exceptional position of frequency trimming leads to a prolongation of the test time, which is associated with high costs. German Patent DE 692 26 656 T2 teaches a semiconductor chip, particularly a semiconductor memory, with at least one oscillator for controlling internal functions, whereby a circuit for automatically trimming the frequency of the oscillator is implemented on the semiconductor chip.

SUMMARY OF THE INVENTION

It is accordingly an object of the invention to provide a semiconductor chip with a trimmable oscillator that overcomes the above-mentioned disadvantages of the prior art devices of this general type, which guarantees the parallel setting of the oscillator frequency for a plurality of semiconductor chips without losses in yield or quality.

With the foregoing and other objects in view there is provided, in accordance with the invention, a semiconductor chip, in particular a memory chip. The semiconductor chip contains at least one oscillator for controlling internal functions and generates an oscillator signal with an oscillating frequency. A trimming circuit is connected to the oscillator for automatically trimming the oscillating frequency of the oscillator. The trimming circuit receives and is driven by an external clock signal having a clock frequency higher than the oscillator frequency. The trimming circuit contains a counter for measuring the oscillator frequency and a trimming logic circuit for comparing the oscillator frequency measured to a desired frequency. The trimming logic circuit outputs a trim command to the oscillator corresponding to a difference between the oscillator frequency measured by the counter and the desired frequency.

With the integration of the trimming circuit on the semiconductor chip, the high outlay that has been required in connection with the utilization of an external testing device to detect and set the oscillator frequency is eliminated, because the process can be carried out on the semiconductor chip itself. The inventive approach thus simplifies the external test program specifically for semiconductor chips on the wafer plane, because the overall testing program, including the test of the oscillator frequency, can run parallel with the other steps.

Another advantage of the inventive trimming circuit that is integrated on the semiconductor chips is that the time required for trimming the oscillator frequency, and with this the testing costs, can be reduced. The time and cost savings are greater the more semiconductor chips are tested in parallel fashion.

Because the external testing device for testing the semiconductor chip specifically on the wafer plane no longer has to be laid out to measure frequencies, corresponding auxiliary equipment that is required for this can be omitted. This is essential particularly in view of the high degree of parallelism of the test measuring procedures, because in certain test devices and systems the number of channels over which the frequency measuring can occur is less than the number of tested semiconductor chips.

Another advantage of the inventive on-chip integrated trimming circuit is that it is also accessible for a self-testing strategy with respect to trimming the oscillator frequency. Note in this regard that the trend in high-density integrated semiconductor chip testing is toward self-testing, which requires only a limited number of external control signals for checking the test run. Unlike in iterative trimming by an external testing device, with the aid of the inventive semiconductor chip which is realized with an integrated trimming circuit and which contains an on-chip trimming circuit for the oscillator frequency, correction addresses do not need to be transferred to the semiconductor chip. This makes possible chip-internal trimming (self-trimming) as an advantageous enhancement for any more far-reaching self-testing strategy in which the interface to the semiconductor chip is reduced to such an extent that a transfer of correction addresses is no longer possible.

Another advantage of the inventive on-chip integrated trimming circuit is that the trimming of the oscillator frequency by the external testing device additionally requires only that one external clock signal be provided, which can be used by a plurality of tested semiconductor chips in a parallel fashion. This requires a single line via a single contact to a test head (i.e. to the external testing device), whereas the conventional approach to external frequency measurement requires a separate line to each of the plurality of chips that are contacted for the test.

According to the invention, given the utilization of an external clock signal, the on-chip trimming circuit contains a counter for detecting the frequency of the on-chip oscillator and a trimming logic for comparing the measured oscillator frequency to a desired frequency and outputting a trim command to the oscillator corresponding to the difference between the oscillator frequency that is detected by the counter and the desired frequency.

An embodiment of the invention further provides that the counter for detecting the oscillator frequency is charged for n (a whole positive number) oscillator periods by the external clock signal, by the oscillator signal itself, and by an enable signal that is generated by the test logic.

On-chip fuses are also advantageously provided for storing corresponding correction information for the on-chip oscillator. Preferably, electrical fuses are utilized for the on-chip fuses. Furthermore, the test logic of the on-chip trimming circuit advantageously generates a pass/fail bit with respect to the trimming outcome, which is either outputted to an external test system or test device via an on-chip interface, or processed by an on-chip self-test controller.

Other features which are considered as characteristic for the invention are set forth in the appended claims.

Although the invention is illustrated and described herein as embodied in a semiconductor chip with a trimmable oscillator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a block diagram of an embodiment of a circuit for trimming a frequency of an oscillator that is integrated on a semiconductor chip with the oscillator for controlling internal functions.

DESCRIPTION OF THE PREFERRED EMBODIMENTS

Referring now to the single FIGURE of the drawing, there is shown a trimming circuit of a semiconductor chip in the form of a DRAM memory, which has a self-refresh control 1. The self-refresh control 1 is charged by an oscillator 2 whose frequency fSRF, which is in the range of several KHz, must be compared to a desired frequency. The oscillator frequency fSRF is determined by the number of rows to be refreshed and a specified retention time, i.e. the time for which a cell must hold the charge without a refresh operation (typically 64 msec). The frequency is thus substantially lower than the clock frequencies utilized in contemporary synchronous DRAM, which are typically 133 mHz. The clock frequency fCLK is fed into the DRAM at a terminal field or PAD 3.

In a normal operation of the DRAM, the oscillator 2 serves for triggering a refresh of the DRAM at periodic intervals.

The inventive trimming circuit that is implemented on the DRAM employs the external clock signal cycles—that is to say, the frequency of an external clock signal (CLK) that is provided by a test system—for measuring the oscillator frequency fSRF. A counter 4 is provided for this purpose, which is charged by the external clock signal with the frequency fCLK on an input side. The counter 4 is also charged by the oscillator frequency fSRF. The oscillator signal with the frequency fSRF activates the counter 4, whereupon the counter 4 counts the cycles (i.e. the frequency fCLK) of the external clock signal.

A test logic 5 is also provided, which is charged by the output signal of the counter 4 and which provides an enable signal (s) with which the counter 4 is charged and thereby activated for exactly n periods (1/fSRF), n being a whole positive number. The number n should be as small as possible, so that the measurements can be performed in an optimally short time. However, if necessary, a certain averaging can be achieved by selecting n>1. In the present case, where fCLK>>fSRF, n=1 is sufficient for executing an accurate measurement.

The test logic 5 also outputs a trim command Adr_trim to the oscillator 2 and is connected to a bank of fuses 8 as described below.

The number of cycles of the clock signal CLK detected by the counter 4 is compared by the test logic 5 to a fixed or programmable desired value. The desired value can also have a different source than the test logic 5. On this basis, the test logic generates the command Adr_trim at a corresponding correction address when the desired value and actual value do not correspond. This makes it possible to modify, i.e. to set or trim, the frequency fSRF of the oscillator 2.

In a new measuring procedure it is preferably checked whether the adjusted or trimmed frequency fSRF of the oscillator 2 corresponds to the desired value for frequency. If a sufficient correspondence is detected by the test logic 5, the last correction value is either immediately deposited into the bank of fuses 8 (preferably E-fuses), or the correction value is externally transmitted to the hard system via an on-board interface 6. On the other hand, if there is no correspondence between the measured frequency and the desired frequency after m measuring and correcting steps (m being the total number of possible correction addresses with the aid of which the frequency of the oscillator 2 can be modified), a faulty DRAM can be presumed. In that case, a pass/fail bit indicating the condition is outputted by the test logic 5, which has an output 7 for this purpose. The output signal is handed over to an on-chip built in self-test controller 10, for example.

Alternatively, the output signal (i.e. the pass/fail formation) can also be driven out directly via the interface and interrogated outside by the test system.

We claim:

1. A semiconductor chip, comprising:

at least one oscillator for controlling internal functions and generates an oscillator signal with an oscillating frequency; and a trimming circuit connected to said oscillator for automatically trimming the oscillating frequency of said oscillator, said trimming circuit receiving and driven by an external clock signal having a clock frequency higher than said oscillator frequency, said trimming circuit containing a counter for measuring the oscillator frequency and a trimming logic circuit for comparing the oscillator frequency measured to a desired frequency and outputting a trim command to said oscillator corresponding to a difference between the oscillator frequency measured by said counter and the desired frequency.

2. The semiconductor chip according to claim 1, wherein:

said trimming logic circuit generates an enable signal and is connected to said counter; and said counter for detecting the oscillator frequency is charged for n oscillator periods, n being a positive whole number, by the external clock signal, the oscillator signal, and the enable signal generated by said trimming logic circuit.

3. The semiconductor chip according to claim 1, further comprising on-chip fuses for storing correction information for the oscillator frequency, said on-chip fuses connected to said trimming logic circuit.

4. The semiconductor chip according to claim 3, wherein said on-chip fuses are electrical fuses.

5. The semiconductor chip according to claim 1, further comprising an on-chip interface for externally outputting a trimmed oscillator frequency and connected to said trimming logic circuit.

6. The semiconductor chip according to claim 5, wherein said trimming logic circuit has an output and supplies a pass/fail bit at said output.

7. The semiconductor chip according to claim 6, wherein the pass/fail bit is further outputted to said on-chip interface.

8. The semiconductor chip according to claim 6, further comprising an on-chip self-test controller connected to and receiving the pass/fail bit from said test logic.

9. The semiconductor chip according to claim 1, wherein the semiconductor chip is a semiconductor memory.

* * * * *